(12) United States Patent
Goodman

(10) Patent No.: US 6,552,853 B2
(45) Date of Patent: Apr. 22, 2003

(54) RADIATION BEAM COMBINER

(75) Inventor: Douglas S. Goodman, Sudbury, MA (US)

(73) Assignee: Polaroid Corporation, Waltham, MA (US)

( * ) Notice: Subject to any disclaimer, the term of this patent is extended or adjusted under 35 U.S.C. 154(b) by 0 days.

(21) Appl. No.: 09/747,918

(22) Filed: Dec. 22, 2000

(65) Prior Publication Data

US 2002/0080831 A1 Jun. 27, 2002

(51) Int. Cl.[7] .......................... G02B 27/10; G02B 5/08; G02B 7/182
(52) U.S. Cl. .......................... 359/627; 359/618; 359/850
(58) Field of Search ................. 359/618, 627, 359/850, 853; 385/33, 31

(56) References Cited

U.S. PATENT DOCUMENTS

| 5,081,637 | A |   | 1/1992 | Fan et al. ............. 372/72 |
| 5,117,311 | A | * | 5/1992 | Nomura ............... 359/819 |
| 5,185,758 | A |   | 2/1993 | Fan et al. ............. 372/72 |
| 5,933,278 | A |   | 8/1999 | Plummer et al. ........ 359/627 |
| 6,075,912 | A |   | 6/2000 | Goodman .............. 385/33 |
| 6,091,554 | A | * | 7/2000 | Sharp et al. ........... 359/819 |
| 2002/0090220 | A1 | * | 7/2002 | Mikami ............... 396/508 |
| 2002/0126401 | A1 | * | 9/2002 | Sasaki ............... 359/823 |

OTHER PUBLICATIONS

"Modern Optical Engineering", Second Edition, Warren J. Smith, McGraw–Hill, Inc. (1990), pp. 96–99.

* cited by examiner

Primary Examiner—Ricky Mack

(57) ABSTRACT

An optical apparatus is disclosed suitable for overlapping a plurality of radiation beams at the input end of an optical waveguide device, such as an optical fiber or fiber laser. The optical apparatus includes a plurality of deflecting facets, where each deflecting facet is oriented so as to deflect incident beams of radiation so that the deflected beams emanate from a virtual multi-beam radiation point source. An output relay optical system captures the deflected beams and causes them to overlap at the input end of the optical waveguide device. Input relay optical systems, which may be tiltable plane parallel plates, may be disposed between sources of the radiation beams and be used to redirect the radiation beams so that they emanate from a virtual multi-beam radiation point source. Methods for adjusting components of the optical apparatus to fine-tune the positions and directions of the radiation beams for more precise overlapping are also disclosed.

39 Claims, 9 Drawing Sheets

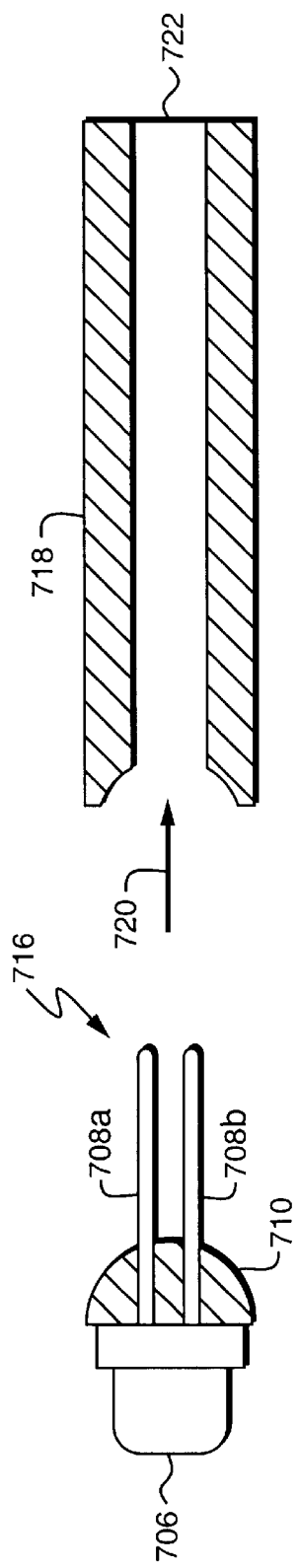
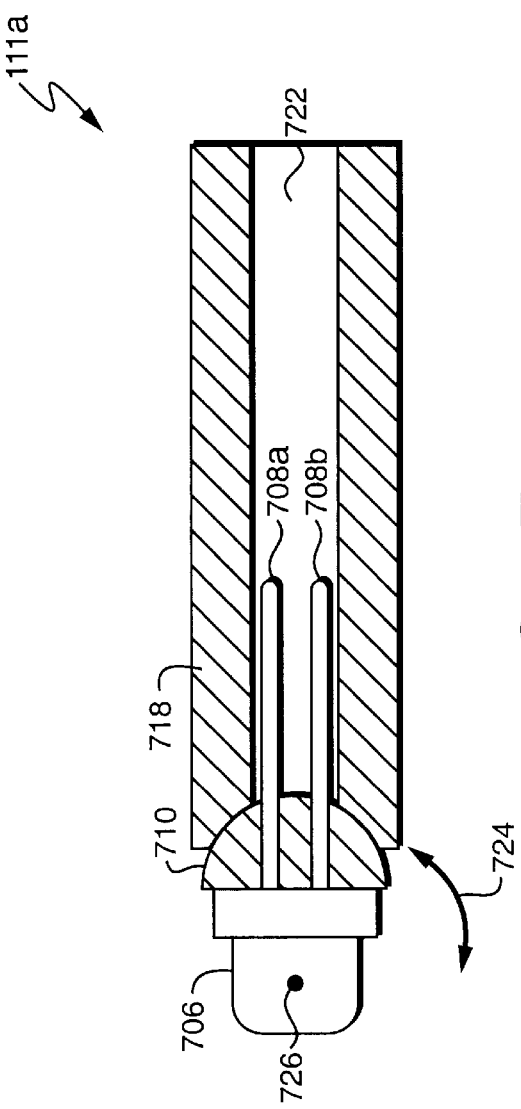
FIG. 7D
FIG. 7E

RADIATION BEAM COMBINER

BACKGROUND

1. Field of the Invention

The present invention generally relates to an apparatus for coupling multiple radiation beams within an area (such as at the input end of an optical waveguide device) and, in particular, to a system using a unitary beam deflector to provide coupling, particularly with discrete sources of laser radiation beams.

2. Related Art

There continues to be a need for ever-increasing levels of radiative power and brightness in applications such as printing, fabrication, telecommunications, photochemical processes, and medical treatment. A commonly-used approach is to optically couple the emission beams from multiple radiative sources into an optical waveguide device, such as an optical fiber or fiber laser, such that output radiation having a higher power level is emitted from the output end of the waveguide. Various systems for performing such coupling are described in commonly-owned U.S. Pat. No. 6,075,912 to Goodman, entitled "Apparatus for Coupling Radiation Beams into an Optical Waveguide," ("the '912 patent"), hereby incorporated by reference in its entirety.

When greater levels of emitted power are required, discrete sources of radiation, such as laser diode devices, may be used. Various systems using such discrete radiation sources are described in the '912 patent. Furthermore, the '912 patent discloses a variety of systems for coupling multiple radiation beams into an optical waveguide device using a unitary beam deflector.

In addition to the need for increasing levels of radiative power, there is also an increasing need for systems providing such radiative power to be small, easy to manufacture, and energy efficient. What is needed, therefore, is an improved system for providing high-power radiation to an optical waveguide device.

SUMMARY

An optical apparatus is disclosed suitable for coupling a plurality of radiation beams within an area, such as the input end of an optical waveguide device (e.g., an optical fiber or fiber laser). The optical apparatus includes a plurality of deflecting facets, where each deflecting facet is oriented so as to deflect incident beams of radiation so that the deflected beams emanate from a virtual multi-beam radiation point source. An output relay optical system captures the deflected beams and couples them within the input end of the optical waveguide device. Input relay optical systems, which may be tiltable plane parallel plates, may be disposed between sources of the radiation beams and be used to redirect the radiation beams so that they emanate from the virtual multi-beam radiation point source. Methods for adjusting components of the optical apparatus to fine-tune the positions and directions of the radiation beams for more precise coupling are also disclosed.

Other features and advantages of the invention will become apparent from the following description and from the claims.

BRIEF DESCRIPTION OF THE DRAWINGS

FIG. 7D is a diagrammatic side plan view of a body of a laser device according to one embodiment of the present invention.

FIG. 7E is a diagrammatic side plan view of a laser device according to one embodiment of the present invention.

DETAILED DESCRIPTION

An optical apparatus is disclosed suitable for coupling a plurality of radiation beams within an area, such as the input end of an optical waveguide device (e.g., an optical fiber or fiber laser). The optical apparatus includes a plurality of deflecting facets, where each deflecting facet is oriented so as to deflect incident beams of radiation so that the deflected beams emanate from a virtual multi-beam radiation point source. An output relay optical system captures the deflected beams and couples them within the input end of the optical waveguide device. Input relay optical systems, which may be tiltable plane parallel plates, may be disposed between sources of the radiation beams and be used to redirect the radiation beams so that they emanate from the virtual multi-beam radiation point source. Methods for adjusting components of the optical apparatus to fine-tune the positions and directions of the radiation beams for more precise coupling are also disclosed.

Figure 1:
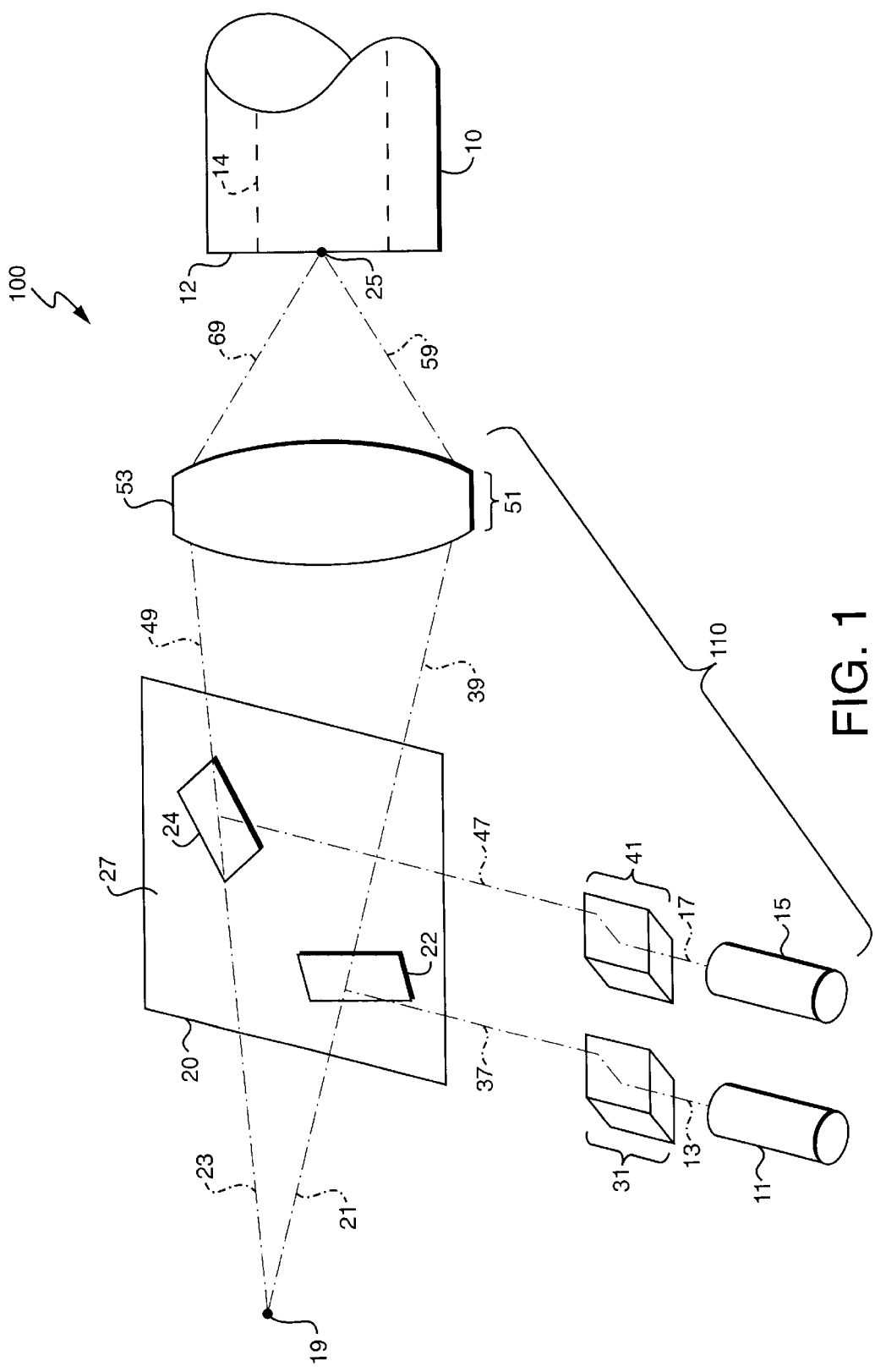
FIG. 1 is a diagrammatic perspective view of an apparatus for coupling a plurality of radiation beams into an input end of an optical fiber according to one embodiment of the present invention.

Referring to FIG. 1, a system 100 is shown for coupling a plurality of radiation beams at the input end of an optical waveguide device, such as an optical fiber 10 or a fiber laser, according to one embodiment of the present invention. It should be appreciated that the system 100 may, however, be used to couple a plurality of radiation beams within an area other than the input end of an optical waveguide device. First laser radiation beam 13 and second laser radiation beam 17 are emitted by discrete laser devices 11 and 15, respectively. It should be appreciated that laser radiation beams described herein, such as laser radiation beams 13 and 17, are illustrated in the drawings with lines representing the principal axes of such radiation beams for ease of illustration.

First laser device 11 and second laser device 15 emit output radiation of wavelengths $\lambda_1$ and $\lambda_2$, respectively, where the wavelengths need not be the same. The laser devices 11 and 15 may be microlensed so that the laser beams 13 and 17 are nominally collimated in one meridian. As used herein, the term "nominally collimated" is used to indicate the fact that perfect collimation is not possible due to physics limitations and imperfections and variations among particular laser beams. Nominal collimation refers to collimation that is substantial although not necessarily perfect.

The coupling of laser radiation beams 13 and 17 at an input end 12 of the optical fiber 10 is accomplished by means of an optical apparatus 110. Although only two discrete laser devices 11 and 15 are shown in FIG. 1 for purposes of clarity in illustration, it should be appreciated that the present invention is not so limited and may be practiced with additional sources of laser radiation having one or more emission wavelengths, or with non-coherent radiation sources such as light-emitting diodes (LEDs) or incandescent devices such as tungsten filament or arc lamps. Furthermore, the laser radiation provided by the laser devices 11 and 15 may be provided by any other laser radiation source, such as the output end of an optical fiber or fiber laser.

Optical apparatus 110 includes a unitary beam deflector 20, a first input optical system 31, a second input optical system 41, and an output optical system 51. First input optical system 31 is positioned in the path of first laser radiation beam 13. First input optical system 31 intercepts and redirects first laser radiation beam 13 as a first redirected radiation beam 37, which is incident upon a first deflecting facet 22. As described in more detail below with respect to FIGS. 6A–6B, in one embodiment of the present invention the first input optical system 31 includes a tiltable plane parallel plate. The tiltable plane parallel plate may be adjusted to shift the first directed laser beam 37 so that first deflected laser radiation beam 39 emanates more precisely from virtual multi-beam radiation point source 19. It should be appreciated that the preceding discussion regarding the first input optical system 31 is equally applicable to the second input optical system 41, which is positioned in the path of the second laser radiation beam 17 and redirects the second laser radiation beam as a second redirected radiation beam 47, which is incident upon a second deflecting facet 24.

Unitary beam deflector 20 includes first deflecting facet 22 and second deflecting facet 24, where first deflecting facet 22 is positioned in the path of first redirected laser radiation beam 37 and is oriented so as to deflect first redirected laser radiation beam 37 as a first deflected laser radiation beam 39. Similarly, second deflecting facet 24 is positioned in the path of second redirected laser radiation beam 47 and is oriented so as to deflect second redirected radiation beam 47 as a second deflected laser beam 49. It should be appreciated that deflecting facets 22 and 24 may be optically smooth and reflective surfaces, as distinguished from a non-faceted surface region 27 of unitary beam deflector 20.

It should be appreciated that first and second input optical systems 31 and 41 are optional and need not be included in the optical apparatus 110 if more precise positioning of the first and second laser radiation beams 13 and 17 is not needed or desired. If, for example, first input optical system 31 is omitted from the optical apparatus 110, then the first laser radiation beam 13 will fall directly incident upon and be deflected by the first deflecting facet 22.

First and second deflecting facets are positioned and oriented so as to deflect redirected laser radiation beams 37 and 47 so that the deflected laser radiation beams 39 and 49 emanate from a virtual multi-beam radiation point source 19. Backward extensions 21 and 23 of the first and second deflected radiation beams 39 and 49, respectively, overlap at the virtual point source 19. It should be appreciated that the backward extensions 21 and 23 are not real radiation beams, and that the virtual point source 19 is not a real radiation source, but that these elements are shown in FIG. 1 merely for purposes of illustration. In one embodiment of the present invention, first and second input optical systems 31 and may be positioned and/or adjusted to redirect first and second redirected laser radiation beams 37 and 47 so that they emanate from the virtual multi-beam radiation point source 19.

In one embodiment of the present invention, deflecting facets 22 and 24 are substantially planar and may be formed in unitary beam deflector 20 by known methods, such as diamond machining. It should be appreciated that facets 22 and 24 may also been nonplanar. In an alternative method of manufacture, unitary beam deflector 20 may be fabricated as more than one component and may be formed into a unitary part by appropriate means. In one embodiment of the present invention, deflecting facets 22 and 24 are subsequently plated or optically coated so as to increase reflectivity at the wavelengths of the emissions of lasers 11 and 15. It should also be noted that it is not a requirement that radiation beams 13 and 17 lie in a common plane, and input end 12 of optical fiber 10 need not lie in a common plane with radiation beams 13 and 17.

Output optical system 51 may be either an afocal relay system, a focal relay system, or any combination thereof. For example, in one embodiment of the present invention, as shown in FIG. 1, the output optical system 51 is a biconvex lens 53. The deflected radiation beams 39 and 49 are focused by the biconvex lens at the input end 12 of the optical fiber 10 as first and second overlapping radiation beams 59 and 69, respectively. Ideally, the overlapping radiation beams 59 and 69 overlap at a point 25 at the input end 12 of the optical fiber 10, forming an image of the virtual multi-beam radiation point source 19. In particular implementations, however, the overlapping radiation beams 59 and 69 may overlap to various degrees due to imperfections and variations in the components of the optical apparatus 110. In another embodiment of the present invention, the output optical system 51 is an afocal relay system, such as a pair of biconvex lenses having focal lengths $f_1$ and $f_2$, respectively, and whose internal principal planes are separated by the distance $f_1+f_2$.

In general, the output optical system 51 may relay the overlapping radiation beams 59 and 69 in any of a variety of ways such that the overlapping radiation beams 59 and 69 are incident upon the input end 12 of the optical fiber 10 at angles that are no greater than the acceptance angle of the optical fiber 10. The overlap point 25 may therefore more generally be considered to be an overlap region which is intersected by the principal axes of the overlapping radiation beams 59 and 69. It should be further appreciated that in particular implementations the virtual point source 19 may not be a true point due to physical constraints and variations in the components of the optical apparatus 110.

Figure 2:
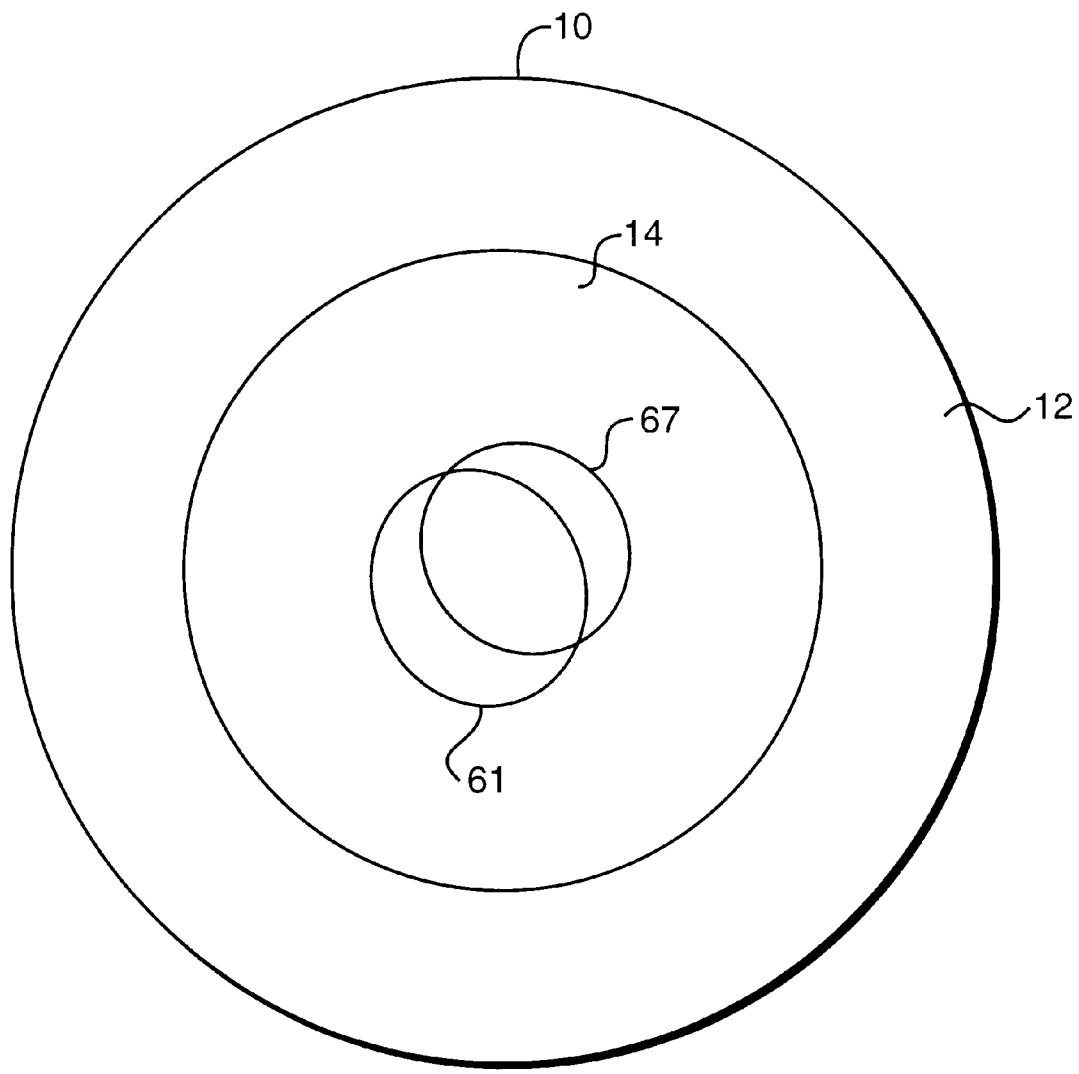
FIG. 2 is a diagram illustrating the overlap of radiation beams at the input end of the optical fiber of FIG. 1 according to one embodiment of the present invention.

Referring to FIG. 2, optical fiber 10 includes a core 14 surrounded by a cladding layer 12. A cross-section 67 of overlapping radiation beam 59 at the input end 12 of the optical fiber 10 is shown. Similarly, an irradiance distribution 61 of overlapping radiation beam 69 at the input end 12 of the optical fiber 10 is shown. Components of the optical apparatus 110, such as input optical systems 31 and 41, deflecting facets 22 and 24, and output optical system 51, are sized, positioned, and oriented such that irradiance distributions 61 and 67 fall within the core 14 as shown. Note that irradiance distributions 61 and 67 partially overlap. This is not, however, a limitation of the present invention, and the irradiance distributions 61 and 67 may not overlap at the input end 12 of the optical fiber 10. Note that the transverse axes of the beams 59 and 69 need not be aligned with each other, and that the sizes and shapes of the irradiance distributions 61 and 67 need not be identical.

It should be appreciated that the first laser beam 13, the first redirected laser beam 37, the first deflected laser beam 39, and the first overlapping laser beam 59 are segments of the same laser beam and are distinctly labeled and described herein merely for purposes of illustration.

Figure 3:
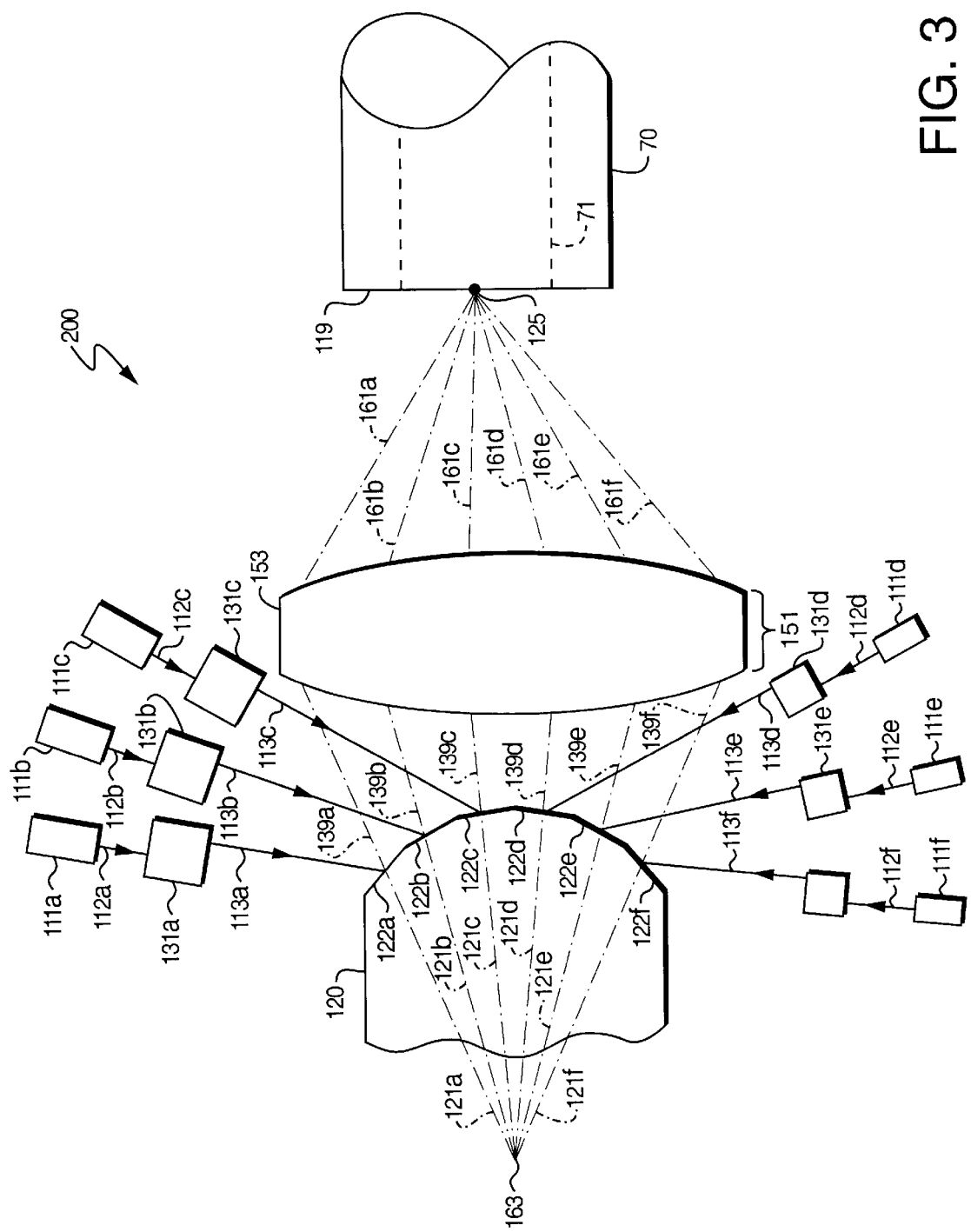
FIG. 3 is a diagrammatic plan view of a coupling apparatus including a unitary beam deflector illustrating the optical coupling of six sources of coherent radiation into a fiber laser according to one embodiment of the present invention.
Figure 4:
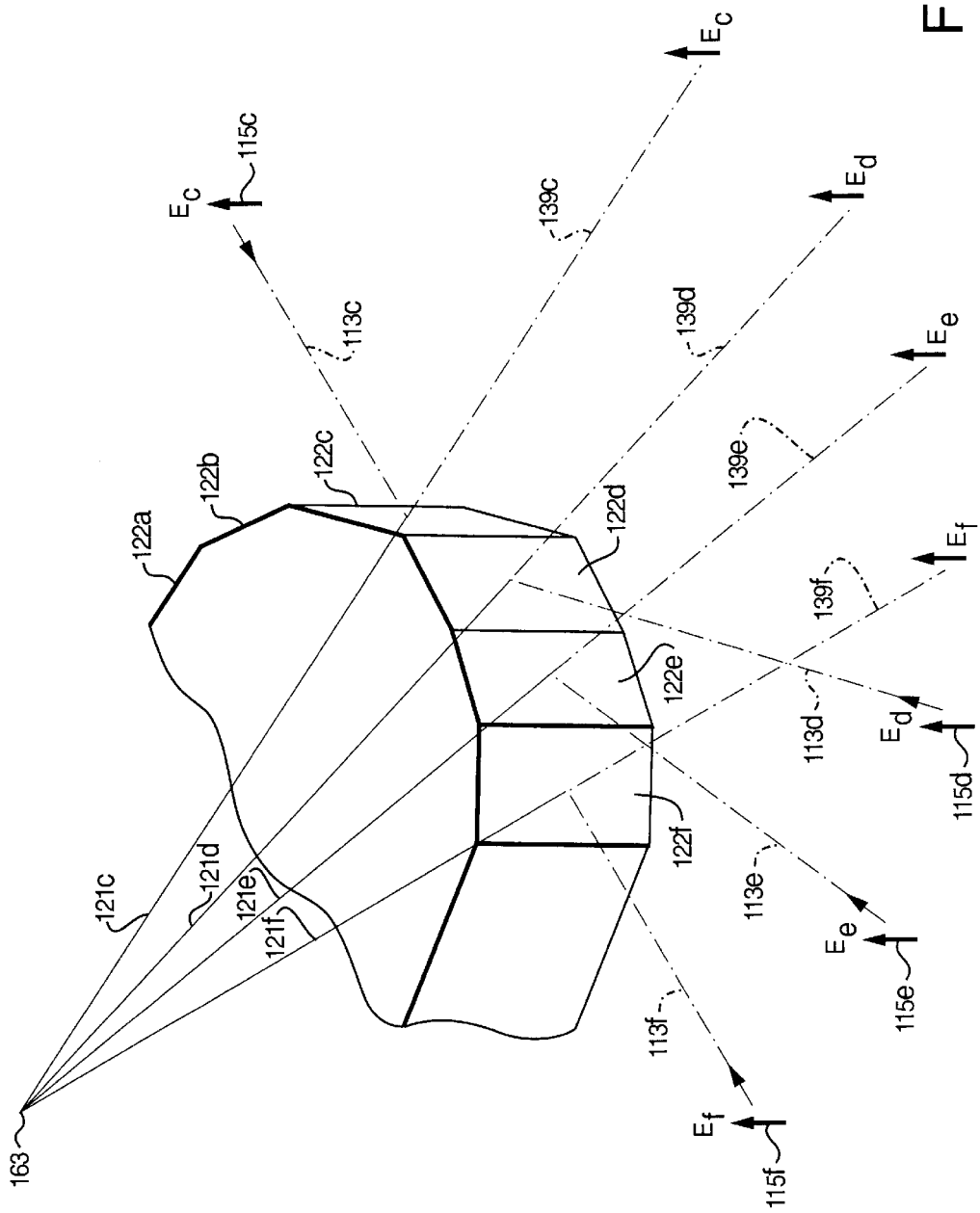
FIG. 4 is a diagrammatic perspective view of the unitary beam deflector of FIG. 3.

In another embodiment, shown in FIGS. 3 and 4, an optical apparatus 200 is used to combine the radiation outputs of six discrete laser devices 111a through 111f, outputting laser radiation beams 112a–112f, respectively, into an optical waveguide device. Applications of the optical system 200 include fiber laser pumping, photochemical processes, telecommunications, and printing.

As shown in FIG. 3, laser radiation beams 112a–f output by discrete laser devices 111a–f are coupled into an inner cladding 71 of a fiber laser 70. Optical apparatus 200 includes a unitary beam deflector 120, input relay systems 131a through 131f, and output relay system 151. Unitary beam deflector 120 includes six rectangular deflecting facets 122a through 122f. It should be appreciated that although six laser devices 111a–f are shown in FIG. 3, there may be any number of laser devices. For example, in one embodiment of the present invention, there are eight laser devices. In one embodiment of the present invention, the laser devices 111a–f are multimode lasers, and laser radiation beams 112a–f are collimated in one meridian. It should be appreciated that the laser devices 111a–f may also be single mode lasers.

Laser radiation beam 112a of laser device 111a is redirected onto deflecting facet 122a by input relay system 131a as a first redirected laser radiation beam 113a. Deflecting facet 122a is oriented so as to deflect the redirected radiation beam 113a as a first deflected radiation beam 139a. Output relay system 151 is positioned in the path of deflected beam 139a so as to redirect the deflected beam 139a onto input end 119 of fiber laser 70 as a first overlapping laser radiation beam 161a. Each of deflecting facets 122b through 122f is likewise oriented to deflect redirected laser radiation beams 113b–113f as deflected radiation beams 139a–f, respectively. Output optical system 151 focuses deflected radiation beams 139a–f as overlapping radiation beams 161a through 161f at an overlap point 125 at input end 119 of fiber laser 70.

Deflecting facets 122a–122f are positioned and oriented so as to deflect redirected laser radiation beams 113a–f so that the deflected laser radiation beams 139a–f emanate from a virtual multi-beam radiation point source 163. Backward extensions 121a–121f of deflected laser radiation beams 139a–139f, respectively, overlap at the virtual point source 163. It should be appreciated that the backward extensions 121a–121f are not real radiation beams, and that the virtual point source 163 is not a real radiation source, but that these elements are shown in FIG. 3 merely for purposes of example.

It should further be appreciated that the particular orientations of the facets 122a–f shown in FIG. 3 are provided merely for purposes of example and do not constitute limitations of the present invention. Rather, facets 122a–f may be constructed and arranged in any manner such that backward extensions 121a–f converge at the virtual multi-beam radiation point source 163. For example, those of ordinary skill in the art will appreciate how to modify the deflectors shown in FIGS. 6–10 of the '912 patent to redirect the incident beams outward from a virtual multi-beam radiation point source.

Figure 5:
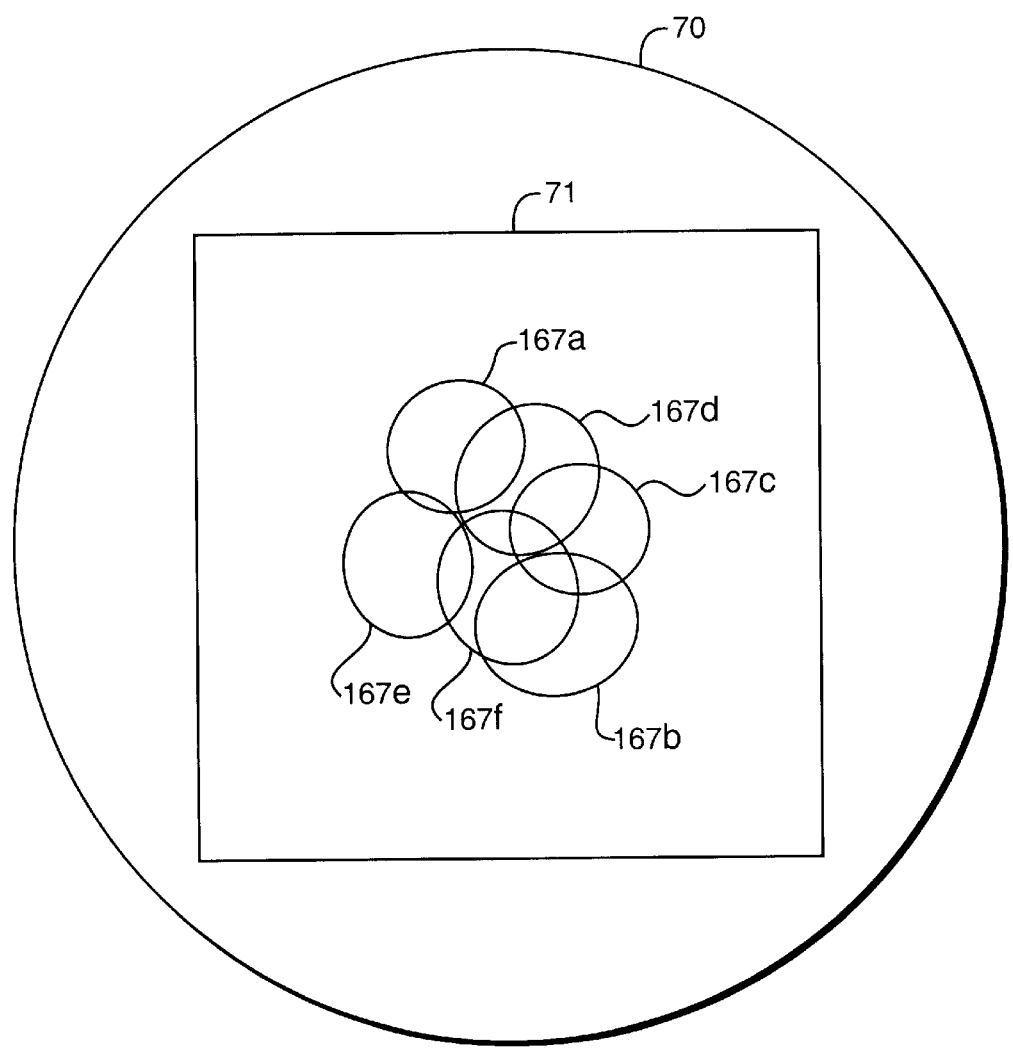
FIG. 5 is a diagram illustrating the overlap of radiation beams at the input end of the fiber laser of FIG. 3 according to one embodiment of the present invention.

Referring to FIG. 5, in one embodiment of the present invention, fiber laser 70 includes inner cladding 71. Overlapping beams 161a–161f are projected into inner cladding 71. Irradiance distributions 167a–167f of overlapping beams 161a–161f at the input end 119 of the fiber laser 70 are shown in FIG. 5. Note that irradiance distributions 167a–167f partially overlap. This is not, however, a limitation of the present invention, and the irradiance distributions 167a–f may or may not overlap at the input end 12 of the optical fiber 10. Inner cladding 71 is here shown as having a rectangular cross-sectional shape, but may have any of a variety of shapes.

In the example provided, the redirected laser radiation beams 113a–113f propagate in the plane of FIG. 3. Accordingly, each of deflecting facets 112a through 122f is orthogonal to this plane, as shown in FIG. 4. Note that for clarity of illustration, only radiation beams 113c through 113f are shown in FIG. 4, although it should be appreciated that all six radiation beams 122a–f or any subset thereof may be utilized in this particular configuration. The dimensions of each deflecting facet 122a through 122f are selected so as to reflect most or all of the radiation incident thereon. In the example shown, the height of each deflecting facet is chosen to intercept and redirect the projection of the lateral component of the incident laser radiation, and the width of each deflecting facet is sized to intercept and redirect the projection of the transverse component of the incident laser radiation.

As shown in FIG. 4, in one embodiment of the present invention unitary beam deflector 120 maintains relative polarization alignment. Beam polarization vector components $E_c$ through $E_f$, denoted as 115c–115f, respectively, are parallel to one another prior to deflection from unitary beam deflector 120 and maintain this relative alignment after deflection. It should be appreciated that this alignment is maintained because the normal of each of the deflecting facets 122a through 122f is parallel to the plane of FIG. 3.

In one embodiment of the present invention, laser devices 111a through 111f comprise laser diodes disposed approximately 80 mm from respective deflecting facets 122a–f. Deflecting facets 122a through 122f are approximately 3.0 mm by 0.5 mm wide. Output optical relay system 151 images deflected output emissions 113a through 113f onto an input end 119 of fiber laser 70 as overlapping radiation beams approximately 3.0 mm by 0.05 mm. The overlapping radiation beams are projected into a fiber laser comprising a square inner cladding approximately 0.2 mm by 0.2 mm.

It should be appreciated that the embodiments of the present invention described above have numerous advantages. For example, the optical apparatus 200 advantageously couples multiple radiation beams from discrete sources into an optical waveguide, thereby providing higher-power radiation to the waveguide than would be achieved using any of the individual radiation sources alone. The virtual multi-beam radiation point source 163 effectively acts as a single radiation source that provides almost as much power as all of the laser devices 111a–f combined.

Furthermore, use of the virtual multi-beam radiation point source 163 facilitates provision of this large amount of power in a small space by concentrating the overlapping radiation beams 161a–f at the input end 119 of the fiber laser 70.

A further advantage of various embodiments of the present invention is that the overlapping radiation beams 161a–f are combined while maintaining relative alignment of the beam directions of polarization. As a result, outputs of two or more of the optical systems 200 (not shown) may be combined, if the polarizations of the outputs of the optical systems are orthogonal to each other, to obtain radiation output with even higher power. For example, a polarizing beam-splitter may be used to combine the two outputs into a single output beam.

The curvatures of the sides of the biconvex lens 153 may be advantageously chosen to improve the focus of the overlapping beams 161a–f at the overlap point 125. Aspherical surfaces may be used on the biconvex lens 153 to compensate for spherical aberration. The angles of the facets 122a–f may also be chosen to pre-compensate for spherical aberration. Compensating for spherical aberration using the facets 122a–f allows the optical system 200 to be less expensive to manufacture, since it is less expensive to manufacture and orient mirrors than to accurately machine the bi-convex lens 153 with aspherical surfaces.

Various other embodiments are also within the scope of the present invention, such as the following. The output optical systems 51 and 151 may be refractive, reflective, or any combination thereof. The laser devices 111a–f may be the same or differ from each other in any combination, and may be driven in unison or separately. The laser devices 111a–f may be wired in series, in parallel, independently, or in any combination thereof. Furthermore, the laser devices 111a–f may be modulated independently of each other.

If the total power provided by all of the laser devices 111a–f is not necessary or desired, fewer than all of the laser devices 111a–f may be utilized at any particular time. Additional ones of the laser devices 111a–f may be utilized as backup radiation sources to be switched on in the event that one of the other laser devices 111a–f fails. Overlapping beams 161a–f need not be evenly distributed at the input end 119 of the fiber laser 70 or enter the fiber laser 70 at the same angle.

Non-planar arrangements of components of the optical apparatus 200 are also possible. For example, in one embodiment of the present invention, the output optical relay system 151 includes a mirror that is tilted to reflect the deflected radiation beams 139a–f at a desired angle.

As described above, in one embodiment of the present invention, the input optical systems 31 and 41 (FIG. 1) and the input optical systems 131a–131f (FIG. 3) may include tiltable plane parallel plates. Tiltable plane parallel plates are well-known to those of ordinary skill in the art and are described, for example, in *Modern Optical Engineering*, Second Edition, Warren J. Smith, McGraw-Hill (1990), pp. 96–99, which is hereby incorporated by reference.

Figure 6A:
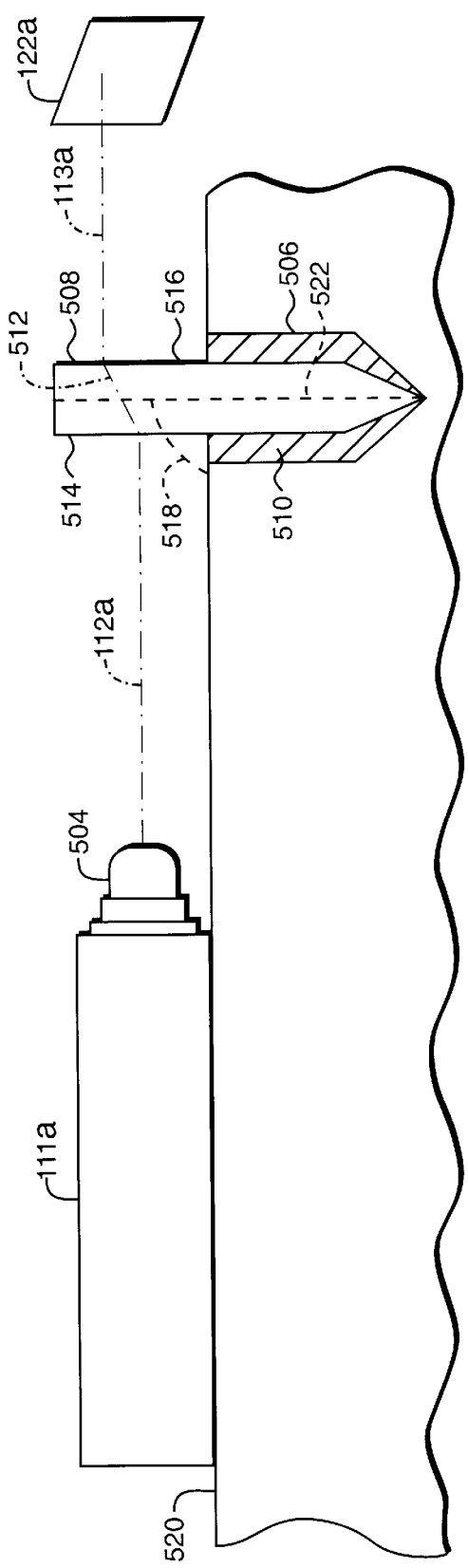
FIG. 6A is a diagrammatic side plan view of a system including a tiltable plane parallel plate for performing planar adjustment of a laser radiation beam emitted by a laser device in the coupling apparatus of FIG. 3.

For example, FIG. 6A is a diagrammatic side view of a tiltable plane parallel plate 508 disposed between laser device 112a and the deflecting facet 122a. The laser device 112a rests upon and is secured to a surface 520 that generally lies in the plane of FIG. 3. Laser device 112a includes a can 504 that emits laser radiation beam 112a generally in the plane of FIG. 3.

Tiltable plane parallel plate 508 is secured within a cavity 506 by cement 510. As described in more detail below, the tiltable plane parallel plate 508 may be secured by a variety of means other than cement 510. Tiltable plane parallel plate 508 is oriented within cavity 506 such that an axis 522 of tiltable plane parallel plate 508 forms an angle $\alpha_t$ with surface 520.

Laser radiation beam 112a is incident upon a first surface 514 of tiltable plane parallel plate 508 at an angle $\alpha_i$. Laser radiation beam 112a is refracted to produce internal laser radiation beam 512 within tiltable plane parallel plate 508 at an angle perpendicular to the first surface 514. Internal radiation beam 512 is incident upon second surface 516 and is refracted to produce redirected laser radiation beam 113a at angle $\alpha_i$ to second surface 516. Redirected laser beam 113a is incident upon facet 122a.

It should be appreciated that the effect of the tiltable plane parallel plate 508 is to shift the laser radiation beam 112a within the plane of FIG. 6A without substantially affecting the angle between the laser radiation beam 112a and the surface 520. The tiltable plane parallel plate 508 may thus be advantageously employed to more precisely direct the laser radiation beam 112a onto the deflecting facet 122a so that the deflected radiation beam 139a emanates more precisely from the virtual radiation point source 163. By employing similar tiltable plane parallel plates with the other laser radiation beams 112b–112f, the laser radiation beams 112a–112f may be more precisely overlapped at the overlap point 125.

The angle 518 may be chosen in any of a variety of ways. For example, in one embodiment of the present invention, the tiltable plane parallel plate 508 is placed in the cavity 506 at an initial angle and without any securing mechanism (e.g., the cement 510). The laser device 112a is activated, causing the tiltable plane parallel plate 508 to redirect the laser radiation beam 112a as the redirected laser radiation beam 113a onto the deflecting facet 122a. The angle 518 of the tiltable plane parallel plate 508 is adjusted until the redirected laser radiation beam 113a is incident upon the deflecting facet 122a at a desired height, such that the deflected radiation beam 139a emanates more precisely from the virtual point source 163. Alternatively, the angle 518 may be adjusted until the overlapping beam 161a (FIG. 3) is incident upon the input end 119a of the fiber laser 70 at a desired location or within a desired region. Alternatively, the angles of tiltable plane parallel plates disposed between the laser devices 111a–111f and deflecting facets 122a–122f may be adjusted in combination until cross-sections 161a–161f (FIG. 5) are coupled within a desired area or in a desired configuration. A video camera or other image capture device may be placed at the overlap point 125 to aid in the adjustment of the tiltable plane parallel plate angle(s).

Figure 6B:
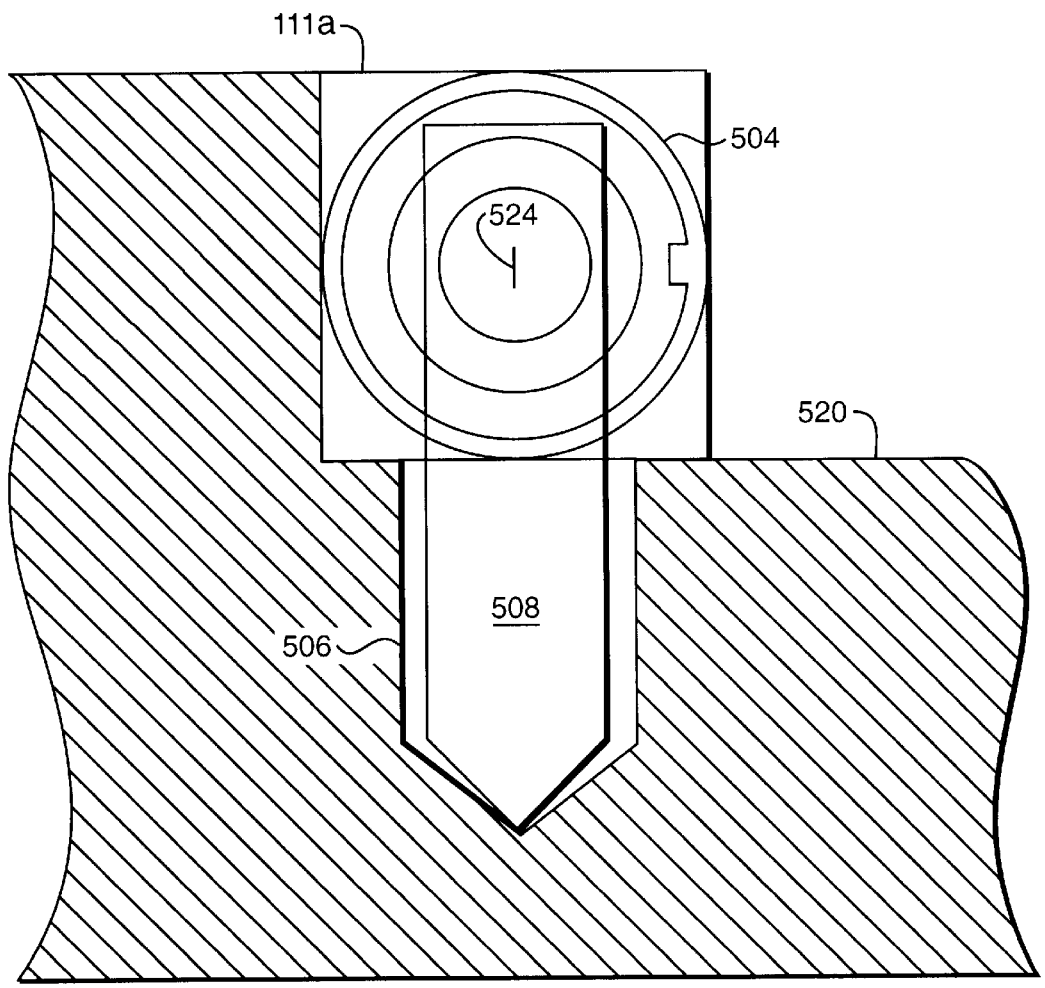
FIG. 6B is a diagrammatic front plan view of the system of FIG. 6A.

Referring to FIG. 6B, a diagrammatic front plan view of the laser device 111a of FIG. 6A is shown. As shown in FIG. 6B, can 504 includes an emission region 524 for emitting laser radiation beam 112a. The precise location of the emission region 524 typically varies from can to can. For example, as shown in FIG. 6B, the emission region 524 is roughly in the center of the can 504. However, the emission region 524 may be location at any of various points on the surface of the can 504 due to variations resulting from the manufacturing process. As a result, laser radiation beams may be output from a variety of locations on different cans. It may be impossible or overly burdensome to modify the location of the emission region 524 by directly modifying the can, particular if mass-produced and/or hermetically-sealed cans are used. Tiltable plane parallel plates may therefore be particularly useful when used in conjunction with cans and laser devices among which the location of the emission region 524 varies. Tiltable plane parallel plates may be used in such circumstances to correct the locations of the laser radiation beams without requiring modification to the structure or position of the laser devices 111a–111f.

It should be appreciated that tiltable plane parallel plate 508 may also be rotated around the axis 522 to shift the laser radiation beam 112a within the plane of FIG. 3. Such rotation may be used instead of or in addition to the adjustment of the angle 518 described above. It should further be appreciated that the laser radiation beam 112a may be incident upon any point on the tiltable plane parallel plate 508 so long as the redirected laser radiation beam 113a may exit from the second surface 516 of the tiltable plane parallel plate 508.

It should be appreciated that although the bottom of the cavity 506 and the tiltable plane parallel plate 508 are shown in FIG. 6A as being tapered to a point, this is not a limitation of the present invention. Rather, the bottoms of the cavity 506 and of the tiltable plane parallel plate 508 may be any shape. For example, in one embodiment of the present invention, the bottoms of the cavity 506 and the tiltable plane parallel plate 508 are flat, and in another embodiment of the present invention they are round.

It should be appreciated that the particular shapes of the tiltable plane parallel plates 508, 554, and 556 are shown and described merely as examples and do not constitute limitations of the present invention. Rather, any tiltable plane parallel plates may be used. Furthermore, adjustment of the tiltable plane parallel plates, as described above, need not involve rotation of the plate about an axis, but may include any kind of adjustment. Tiltable plane parallel plates that are suitable for use with various embodiments of the present invention include any object constructed from transparent material that may be used to redirect the radiation beams 112a–f onto the facets 122a–f using refraction.

In addition to or instead of the planar adjustments described above, various angular adjustments may be made to the laser radiation beams 111a–111f in various embodiments of the present invention. For example, referring to FIG. 7A, a diagrammatic side plan view of a sealed laser 702 and a swivel 710 for mounting the sealed laser 702 are shown according to one embodiment of the present invention. The sealed laser 702 includes a can 706 (which may, for example, be the same as the can 504 shown in FIG. 6A) that is approximately 9 mm in diameter and contains a hermetically-sealed microlensed laser. The swivel 710 has a spherical surface including two holes 712a and 712b (also shown in a diagrammatic top plan view in FIG. 7C) for receiving pins 708a and 708b, respectively, of the sealed laser 702. The swivel 710 may, however, have fewer or greater than two holes, and each hole may contain one or more electrical leads. The center of curvature of the swivel 710 is at or near the emission region 524 of the sealed laser 702.

Figure 7A:
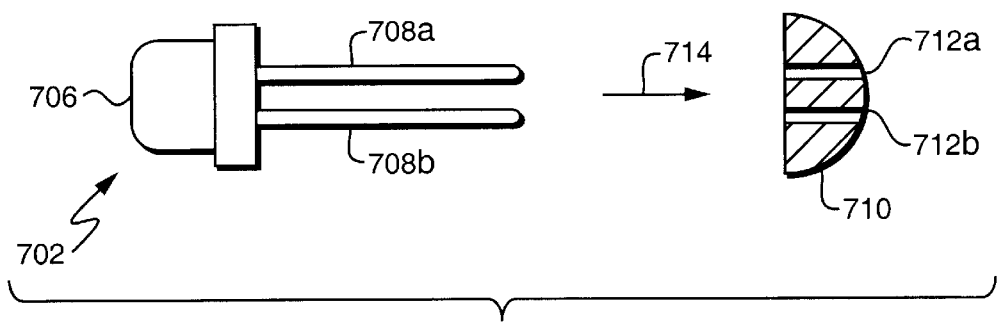
FIG. 7A is a diagrammatic side plan view of a sealed laser and a swivel for housing the sealed laser according to one embodiment of the present invention.
Figure 7B:
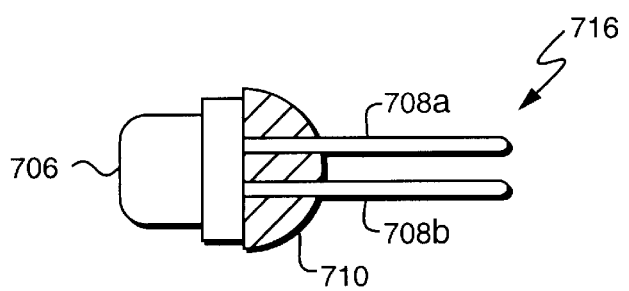
FIG. 7B is a diagrammatic side plan view of a housed laser according to one embodiment of the present invention.
Figure 7C:
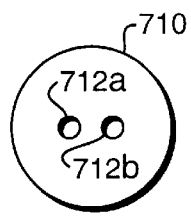
FIG. 7C is a diagrammatic front plan view of a swivel for housing a sealed laser according to one embodiment of the present invention.

The sealed laser 702 may be mounted in the swivel 710 by inserting pins 708a–b into the holes 712a–b in the direction indicated by the arrow 714, forming a mounted laser 716 as shown in FIG. 7B. The pins 708a–b are suitable insulated from the swivel 710. The sealed laser 702 may be secured within the swivel 710 using cement or any other suitable fastening mechanism.

The mounted laser 716 may be secured within the laser device 111a (and the other laser devices 111b–f) as follows. Referring to FIG. 7D, a body 718 of the laser device 111a is shown in a diagrammatic side plan view. Although the body 718 is shown as having a rectangular shape, the body 718 may be square, round, hexagonal, or any other shape. As shown in FIG. 7D, body 718 includes a cavity 722. Mounted laser 716 may be inserted into the cavity 722 in the direction of the arrow 720, and secured within the cavity 722 to form laser device 111a. As shown in FIG. 7E, there is space between the pins 708a–b and the walls of the cavity 722. This allows the mounted laser 716 to rotate within the body 718 in, for example, the directions shown by the arrow 724 around point 726, which is at the center of cap 706. It should be appreciated that such rotation will cause the angle of the laser radiation beam 112a emitted from the mounted laser 716 to change within the plane of FIG. 7E. The mounted laser 716 may also rotate, for example, about the principal axis of the laser radiation beam 112a emitted from the mounted laser 716. Close contact between the swivel 710 and the body 718 allows dissipation of heat through the body 718 and the surface 520.

Although not shown in FIG. 7E, it should be appreciated that the pins 708a–b have suitable connectors for connecting to and receiving power from a power source having terminals within body 718. Furthermore, pins 708a–b are suitably shielded from body 718.

In one embodiment of the present invention, the mounted laser 716 is rotated within the body 718 until the redirected laser radiation beam 113a is incident upon the deflecting facet 122a at a desired angle. Alternatively, the mounted laser 716 may be rotated until the overlapping beam 161a (FIG. 3) is incident upon the input end 119a of the fiber laser 70 at a desired location or within a desired region. Alternatively, the angles of housed lasers within laser devices 111a–f may be rotated in combination until cross-sections 161a–161f (FIG. 5) are coupled within a desired area or in a desired configuration. A video camera or other radiation capture device may be placed at the input end 119 of the fiber laser 70 to aid in the adjustment of the mounted laser 716 and housed lasers within laser devices 111b–f. Once the mounted laser 716 has been rotated to a desired position, the mounted laser 716 may be secured within the body 718 using cement or another securing mechanism.

The angular adjustment described above with respect to FIGS. 7D and 7E may be advantageously used to position the laser radiation beams 113a–f more precisely upon the facets 122a–f so that the overlapping radiation beams 161a–f are coupled more precisely at the input end 119 of the fiber laser 70. It may be impossible or overly burdensome to modify the angle of the emission region 524 (FIG. 6B) by directly modifying the can 706, particular if mass-produced and/or hermetically-sealed cans are used. The techniques for angular adjustment described above may therefore be particularly useful when used in conjunction with cans and laser devices among which the angle of laser radiation emission from the emission region 524 varies. The angular adjustment techniques described above may be used in such circumstances to adjust the angles of the laser radiation beams without requiring modification to the structure or position of the laser devices 111a–111f.

It should be appreciated that the planar adjustment techniques described above with respect to FIGS. 6A–6D and the angular adjustment techniques described above with respect to FIGS. 7A–7E may be applied individually or in combination in any order.

It is to be understood that although the invention has been described above in terms of particular embodiments, the foregoing embodiments are provided as illustrative only, and do not limit or define the scope of the invention. Other embodiments are also within the scope of the present invention, which is defined by the scope of the claims below.

What is claimed is:

1. An optical apparatus suitable for coupling a plurality of radiation beams within a predetermined area, the optical apparatus comprising:
   a unitary beam deflector comprising a plurality of substantially planar deflecting facets, said deflecting facets being disposed in optical paths of the plurality of radiation beams and oriented so as to deflect the plurality of radiation beams as a plurality of deflected radiation beams, the plurality of deflected radiation beams substantially emanating from a virtual multi-beam radiation source; and
   output optical imaging means disposed between the plurality of deflecting facets and the predetermined area to image the plurality of deflected radiation beams within the predetermined area as a plurality of imaged radiation beams.

2. The optical apparatus of claim 1, wherein the predetermined area comprises a cross-sectional area of an input end of an optical waveguide device.

3. The optical apparatus of claim 2, wherein the optical waveguide device comprises an optical fiber.

4. The optical apparatus of claim 2, wherein the optical waveguide device comprises a fiber laser.

5. The optical apparatus of claim 1, wherein the output optical imaging means comprises a focal relay system.

6. The optical apparatus of claim 5, wherein the focal relay system comprises a first convex lens and a second convex lens.

7. The optical apparatus of claim 5, where in the focal relay system comprises a biconvex lens.

8. The optical apparatus of claim 5, wherein the focal relay system comprises a lens having at least one aspheric surface.

9. The optical apparatus of claim 1, wherein the output optical imaging means comprises an afocal relay system.

10. The optical apparatus of claim 1, further comprising:
    first input optical imaging means disposed in an optical path between a first one of the plurality of deflecting facets and a first one of the plurality of radiation beams, such that the first radiation beam is redirected onto said first deflecting facet so that a first one of the deflected radiation beams is imaged more precisely within the predetermined area.

11. The optical apparatus of claim 10, wherein the first input optical imaging means is positioned and oriented so that the first deflected radiation beam emanates more precisely from the virtual multi-beam radiation source.

12. The optical apparatus of claim 10, further comprising second input optical imaging means disposed in an optical path between a second one of the plurality of deflecting facets and a second one of the plurality of radiation beams, such that the second radiation beam is redirected onto the second deflecting facet so that a second one of the deflected radiation beams is imaged more precisely within the predetermined area.

13. The optical apparatus of claim 12, wherein the second input optical imaging means is positioned and oriented so that the second deflected radiation beam emanates more precisely from the virtual multi-beam radiation source.

14. The optical apparatus of claim 10, wherein said first input optical imaging means comprises an afocal relay system.

15. The optical apparatus of claim 14, wherein said first input optical imaging means comprises a tiltable plane parallel plate.

16. The optical apparatus of claim 10, wherein said first input optical imaging means comprises a focal relay system.

17. The optical apparatus of claim 1, wherein the output optical imaging means comprises an output optical imaging means having a spherical aberration and wherein the plurality of deflected radiation beams are incident upon the output optical imaging means at locations and angles that compensate for the spherical aberration so that the plurality of deflected radiation beams are imaged within the predetermined area.

18. The optical apparatus of claim 1, wherein irradiance distributions of the plurality of imaged radiation beams at least partially overlap within the predetermined area.

19. The optical apparatus of claim 1, wherein the plurality of radiation beams comprise a plurality of radiation beams that are nominally collimated in one meridian.

20. The optical apparatus of claim 1, further comprising a plurality of microlensed laser devices to emit the plurality of radiation beams.

21. The optical apparatus of claim 20, wherein the microlensed laser devices comprise multimode laser devices.

22. The optical apparatus of claim 20, wherein the microlensed laser devices comprise single mode laser devices.

23. The optical apparatus of claim 20, wherein the microlensed laser devices include cans containing hermetically-sealed lasers.

24. The optical apparatus of claim 1, wherein the unitary beam deflector further comprises a through-hole disposed in the optical path of a nondeflected radiation beam.

25. The optical apparatus of claim 1, wherein at least two of the plurality of radiation beams have different wavelengths.

26. The optical apparatus of claim 1, wherein the plurality of deflected radiation beams have the same relative polarization alignments as the plurality of radiation beams.

27. A method for adjusting the optical apparatus of claim 10, comprising steps of:
    (A) disposing the first input optical imaging means in the optical path between the first deflecting facet and the first radiation beam; and
    (B) adjusting the first input optical imaging means so that the first deflected radiation beam is imaged more precisely within the predetermined area.

28. The method of claim 27, wherein the step (B) comprises a step of adjusting the first input optical imaging means until the first radiation beam emanates from within a predetermined range of the virtual multi-beam radiation source.

29. The method of claim 27, further comprising steps of:
    (C) disposing the second input optical imaging means in the optical path between the second deflecting facet and the second radiation beam; and
    (D) adjusting the second input optical imaging means so that irradiance distributions of a first and second one of the plurality of imaged radiation beams at least partially overlap within the predetermined area.

30. The method of claim 27, further comprising a step of:
    (C) securing the first input optical imaging means in place after performing the step (B).

31. The method of claim 27, wherein the first input optical imaging means comprises a first tiltable plane parallel plate.

32. The method of claim 31, wherein the step (B) comprises a step of tilting the first tiltable plane parallel plate so that the first deflected radiation beams is imaged more precisely within the predetermined area.

33. A method for adjusting the optical apparatus of claim 10, comprising steps of:
    (A) inserting a first radiation emission device into a first laser device body, the first radiation emission device being constructed and arranged to emit a first one of the plurality of radiation beams; and (B) adjusting the first radiation emission device until the first radiation beam is incident upon the first deflecting facet at a first desired angle.

34. The method of claim 33, wherein the step (B) comprises a step of adjusting the first radiation emission device so that the first deflected radiation beam is imaged more precisely within the predetermined area.

35. The method of claim 34, wherein the step (B) comprises a step of adjusting the first radiation emission device until the first deflected radiation beam emanates from within a predetermined range of the virtual multi-beam radiation source.

36. The method of claim 34, further comprising steps of:

(C) inserting a second radiation emission device into a second laser device body, the second radiation emission device being constructed and arranged to emit a second one of the plurality of radiation beams; and (D) adjusting the second radiation emission device until irradiance distributions of the first and second radiation beams at least partially overlap within the predetermined area.

37. The method of claim 33, further comprising a step of:

(C) securing the first radiation emission device in place after performing the step (B).

38. An optical apparatus comprising:

a first unitary beam deflector comprising a first plurality of substantially planar deflecting facets, said first plurality of deflecting facets being disposed in optical paths of a first plurality of radiation beams and oriented so as to deflect the first plurality of radiation beams as a first plurality of deflected radiation beams, the first plurality of deflected radiation beams substantially emanating from a first virtual multi-beam radiation source;

first output optical imaging means disposed between the first plurality of deflecting facets and a predetermined area to image the first plurality of deflected radiation beams within a first predetermined area as a first plurality of imaged radiation beams having a first polarization alignment;

a second unitary beam deflector comprising a second plurality of essentially planar deflecting facets, said second plurality of deflecting facets being disposed in optical paths of a second plurality of radiation beams and oriented so as to deflect the second plurality of radiation beams as a second plurality of deflected radiation beams, the second plurality of deflected radiation beams substantially emanating from a second virtual multi-beam radiation source;

second output optical imaging means disposed between the second plurality of deflecting facets and the predetermined area to image the second plurality of deflected radiation beams within a second predetermined area as a second plurality of imaged radiation beams having a second polarization alignment that is orthogonal to the first polarization alignment; and optical relay means for imaging the first and second plurality of imaged radiation beams within a third predetermined area.

39. The method of claim 38, wherein the third predetermined area is a predetermined area selected from the group consisting of the first and second predetermined areas.

* * * * *